(12) United States Patent
Kimura

(10) Patent No.: US 7,521,778 B2
(45) Date of Patent: Apr. 21, 2009

(54) SEMICONDUCTOR DEVICE AND METHOD OF MANUFACTURING THE SAME

(75) Inventor: Naoto Kimura, Fukuoka (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 153 days.

(21) Appl. No.: 11/594,723

(22) Filed: Nov. 9, 2006

(65) Prior Publication Data

US 2007/0108570 A1 May 17, 2007

(30) Foreign Application Priority Data

Nov. 15, 2005 (JP) ............................. 2005-330301

(51) Int. Cl.
*H01L 23/495* (2006.01)
(52) U.S. Cl. ...................... 257/666; 257/723; 257/686; 257/E23.141
(58) Field of Classification Search ................. 257/784, 257/786, 686, 723, 724, 666
See application file for complete search history.

(56) References Cited

U.S. PATENT DOCUMENTS

2004/0021192 A1* 2/2004 Beauchamp et al. ........ 257/459
2005/0040501 A1* 2/2005 Hagen ......................... 257/660

FOREIGN PATENT DOCUMENTS

| JP | 62-291156 | 12/1987 |
| JP | 5-152503 | 6/1993 |
| JP | 9-283689 | 10/1997 |

* cited by examiner

*Primary Examiner*—Sue A Purvis
*Assistant Examiner*—Krista Soderholm
(74) *Attorney, Agent, or Firm*—McGinn IP Law Group, PLLC

(57) ABSTRACT

There is provided a semiconductor device 100 by which flexibility in interconnection design may be improved. The semiconductor device 100 includes: a lead frame 102 provided with an island 101 and a plurality of lead units 104; a first chip 109 which is mounted on the island 101 at the chip installed surface of the lead frame 102, and, at the same time, is provided with a first conductive pad 117 on the back of a surface opposing to the island 101; a conductive upper wire 113 connecting the first pad 117 and the lead unit 104; a conductive lower wire 115 connecting one lead unit 104 and another lead unit 104 among a plurality of the lead unit 104; and sealing resin 105 which seals the first chip 109.

20 Claims, 13 Drawing Sheets

SEMICONDUCTOR DEVICE AND METHOD OF MANUFACTURING THE SAME

This application is based on Japanese Patent application NO. 2005-330301, the content of which is incorporated hereinto by reference.

BACKGROUND

1. Technical Field

The present invention relates to a semiconductor device and a method of manufacturing the same, and, especially, to a semiconductor device in which a semiconductor chip is mounted on a lead frame.

2. Related Art

Conventionally, semiconductor devices in which semiconductor chips are mounted on a lead frame have been described in Japanese Laid-open patent publication Nos. 62-291156, 5-152503, and 9-283689.

Devices according to Japanese Laid-open patent publication Nos. 62-291156 and 5-152503 among the above documents, have a configuration in which semiconductor chips are installed on both surfaces of a lead frame.

Japanese Laid-open patent publication No. 62-291156 has described that semiconductor chips are installed on both surfaces of a wiring board, and resin sealing is performed for each surface after wire bonding.

Moreover, Japanese Laid-open patent publication No. 5-152503 has described that a plurality of terminal units at locations at different distances from an island unit are provided on the lead frame.

On the other hand, Japanese Laid-open patent publication No. 9-283689 has shown a configuration in which a semiconductor chip is installed on one surface of a lead frame. According to the above configuration, a plurality of semiconductor chips are installed on one surface of a multilayer wiring board, and, at the same time, a lead frame is connected to the wiring board on the back of the surface on which the semiconductor chip is installed.

However, the above-described conventional devices have had room for improvement in flexibility of interconnection design. When specific explanation is made for the above circumstances, a lead frame or a wiring board and a chip are connected to each other by a wire in all the devices according to Japanese Laid-open patent publication Nos. 62-291156, 5-152503, and 9-283689. At this time, it is usual that a conductive member provided on a chip and an external connecting terminal which is adjacent to the above conductive member are connected to each other. Thereby, there have been some cases in which configuration and arrangement for a through path between a chip and an external connecting terminal are limited.

SUMMARY OF THE INVENTION

According to the present invention, there is provided a semiconductor device, including: a lead frame provided with an island unit and a plurality of lead units; a semiconductor chip which is mounted on the island unit, and, at the same time, which is provided with a conductive electrode pad on the back of a surface opposing to the island unit on a chip installed surface of the lead frame; a first conductive wire connecting the electrode pad and the lead unit; a second conductive wire connecting one lead unit and another lead unit among the plurality of lead units; and a sealing resin sealing the semiconductor chip.

Moreover, according to the present invention, there is provided a method of manufacturing a semiconductor device including: mounting a semiconductor chip on a lead frame in such a way that the back of the semiconductor chip, which has the surface provided with a conductive electrode pad, and the back thereof, is opposing to a chip installed surface of an island unit in a lead frame having the island unit and a plurality of lead units; connecting the electrode pad and the lead unit to each other through a first conductive wire; connecting one lead unit and another lead unit, among the plurality of lead units, to each other through a second conductive wire; and sealing the semiconductor chip with sealing resin.

According to the present invention, the flexibility in interconnection design for the whole semiconductor device may be improved because different lead units are connected to each other through a second wire.

According to the present invention, a technology which improves the flexibility in interconnection design for a semiconductor device may be realized by connecting lead units of the lead frame as explained above.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
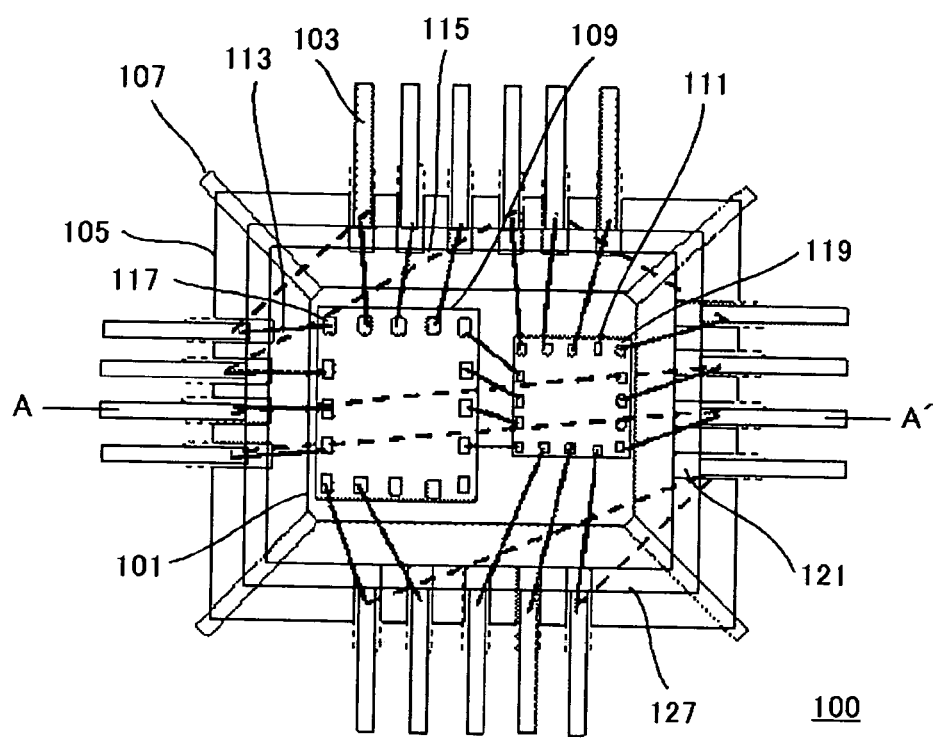
FIG. 1 is a plan view showing a configuration of a semiconductor device according to an embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, embodiments according to the present invention will be explained, referring to drawings. Here, each of common components in all the drawings is denoted by corresponding common reference numerals, and explanation will not be repeated.

Moreover, in the following embodiments, a configuration in which two semiconductor chips are arranged side by side on a lead frame is explained as an example. However, the number of semiconductor chips installed on a lead frame has no limitation, and may be one, or two or three or more.

First Embodiment

FIG. 1 is a plan view showing a configuration of a semiconductor device according to the present embodiment. Moreover, FIG. 2 is a cross-sectional view of the semiconductor device 100 taken along the A-A' line in FIG. 1.

Figure 2:
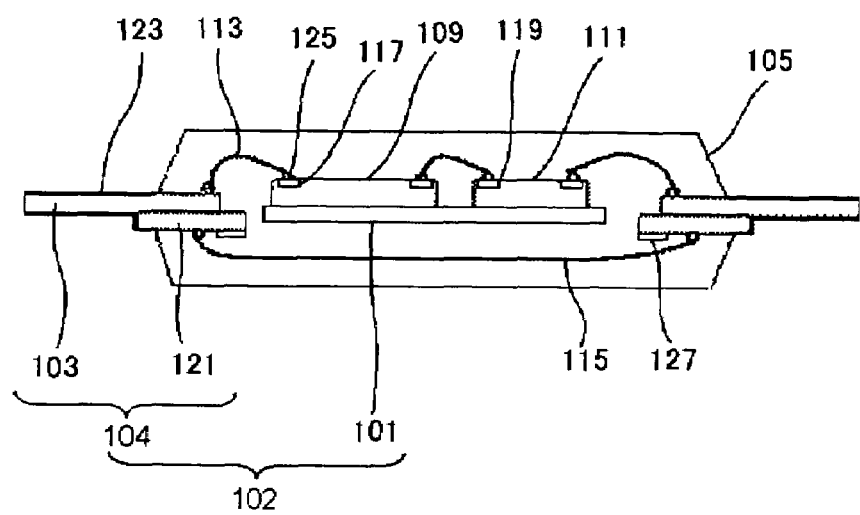
FIG. 2 is a cross-sectional view of the semiconductor device taken along the A-A' line in FIG. 1.

The semiconductor device 100 shown in FIGS. 1 and 2 includes: a lead frame 102 provided with an island unit (island 101) and a plurality of lead units (lead units 104); a semiconductor chip (first chip 109) which is mounted on the island 101 at the chip installed surface of the lead frame 102, and, at the same time, is provided with a conductive electrode pad (a first pad 117) provided on the back of a surface opposing to the island 101; a first conductive wire (conductive upper wire 113) connecting the first pad 117 and the lead unit 104; a second conductive wire (conductive lower wire 115) connecting one lead unit 104 and another lead unit 104 among a plurality of the lead units 104; and sealing resin 105 which seals the first chip 109.

Moreover, the semiconductor device 100 includes a plurality of semiconductor chips (the first chip 109 and a second chip 111). The above two semiconductor chips are arranged side by side on one surface (chip installed surface) of the island 101. The first chip 109 and the second chip 111 are wire-bonded to the lead frame 102.

A plurality of first pads 117 are provided on the first chip 109. The plurality of first pads 117 are arranged in a row along the outer edge of the first chip 109 on the back of a surface opposing to the island 101.

Moreover, a plurality of second pads 119 are provided on the second chip 111. The plurality of second pads 119 are arranged in a row along the outer edge of the second chip 111 on the back of a surface opposing to the island 101.

When the electrode pads are arranged along the edge, an electrode pad and the first lead 103, which are provided in the vicinity of an adjacent region of the semiconductor chip, may be connected to each other. Accordingly, the length of the conductive upper wire 113 may be reduced. Moreover, when the electrode pads are connected to one another, the length of a wire connecting electrode pads may be shortened.

The island 101 has an approximately rectangular plane shape. The island 101 is connected to, and supported by hanger pins 107 at four corners.

The plurality of lead units 104 are arranged side by side along the sides of the rectangular shape of the island 101. Moreover, the plurality of lead units 104 are arranged in the outer region in such a way that the island 101 is surrounded by the plurality of lead units. Each of the lead units 104 is extending in a direction perpendicular to the side of the rectangular shape of the island 101.

The lead frame 102 includes the island 101 and the lead units 104. Metal such as copper is assumed to be used for the material of the lead frame 102. The lead unit 104 has the first lead 103, and a second lead 121. Here, the island 101 and, for example, the first lead 103 may be continuously integrated into one body.

The first lead 103 is arranged on the side of the chip installed surface of the lead frame 102, and is connected to the conductive upper wire 113. The first lead 103 includes a region which is embedded in the sealing resin 105, and a region which is protruding from the sealing resin 105, and functions as an external connecting terminal. FIG. 2 illustrates a configuration in which the island 101 and the first lead 103 are located on the same level with each other in a direction normal to the island 101, and the second lead 121 is provided under the island 101 and the lead 103 (on the side of the back of the chip installed surface).

Moreover, the second lead 121 is arranged under the first lead 103. The semiconductor device 100 has an illustrated configuration in which a part of the second lead 121 is protruding from the sealing resin 105. More specifically, the second lead 121 is provided on the back of the surface of the first lead 103, wherein the surface is connected to the conductive upper wire 113, and is electrically connected to the first lead 103, and, at the same time, to the conductive lower wire 115.

Moreover, the surfaces of the first and second leads 103 and 121 are coated with a plating film 123. The first lead 103 and the second lead 121 are coupled to each other through the above exterior plating, and are electrically connected to each other. The strength of the lead unit 104 may be improved by the above-described configuration for the lead unit 104. Moreover, connecting stability between the first lead 103 and the second lead 121 may be also improved. Here, metal such as silver is assumed to be used for the material of the plating film 123.

The semiconductor device 100 includes a plurality of conductive upper wires 113 and a plurality of conductive lower wires 115. All the above wires are embedded in sealing resin 105. Moreover, the conductive upper wires 113 are shown by solid lines, and the conductive lower wires 115 are by dashed lines in FIG. 1 and FIG. 9 which will be described later.

The conductive upper wire 113 includes: a wire connecting the lead unit 104 and the first pad 117 of the first chip 109; a wire connecting the lead unit 104 and the second pad 119 of the second chip 111; and a wire which connects the first pad 117 and the second pad 119. The conductive upper wire 113 is connected to the first pad 117 and the second pad 119 through a bump 125. All the above conductive upper wires 113 are arranged on the side of the chip installed surface of the lead frame 102.

The conductive lower wire 115 connects the different lead units 104 on the side of the back of the chip installed surface of the lead frame 102. As the conductive lower wire 115 connects one lead unit 104 and another lead unit 104 on the side of the back of the chip installed surface, further reliable connection between the lead units 104 may be realized. The conductive lower wire 115 may connect one lead unit 104 and another lead unit 104 through the side of the back of the surface on which the first chip 109 and the second chip 111 are installed. Even when the lead units 104 are connected to each other across the side of the back of the surface on which the semiconductor chips are installed, contact between wires, defective embedding of wires and the like may be inhibited and manufacturing stability may be improved by connecting the lead units 104 on the side of the back of the chip installed surface.

Each of the lead units 104 connected through the conductive lower wire 115 is arranged in the side of different sides of the rectangular island 101. One lead unit 104 and another lead unit 104 may be provided through the island 101. Moreover, one lead unit 104 and another lead unit 104, which are connected to each other through the second lead 121, may be provided so as to be opposing to each other through the island 101. At this time, the conductive lower wire 115 connects the second leads 121 each of which is provided in the side of either of the opposing two sides of the island 101.

As the conductive lower wire 115 connects one lead unit 104 and another lead unit 104 on the side of the back of the chip installed surface, further reliable connection between the lead units 104 striding over the island 101 may be realized. Thereby, the flexibility in interconnection for the semiconductor device 100 may be further reliably improved.

Moreover, a conductive lower wire 115 may connect conductive lower wires 115 which are provided in the vicinity of each of adjacent two sides of the island 101.

FIG. 1 illustrates a configuration in which there are included a conductive lower wire 115, which connects the lead units 104 opposing to each other through the island 101, and a conductive lower wire 115, which connects the lead units 104 provided on the adjacent sides of the island 101.

Moreover, bonding tape 127 is provided on the second lead 121.

The bonding tape 127 is an insulating member provided in the end of the second lead 121 on the side of the island 101, or in the vicinity thereof on the back of the lead frame 102. The conductive lower wire 115 is connected to the second lead 121 at a location nearer to the edge of the semiconductor device 100 than the bonding tape 127. As the above-described configuration may prevent the conductive lower wire 115 from being in contact with the first lead 103 and the like on the side of the back of the chip installed surface, a short circuit caused through the sealing resin 105 may be more effectively inhibited.

Subsequently, a method of manufacturing the semiconductor device 100 shown in FIGS. 1 and 2 will be explained. FIG. 3 to FIG. 8 are cross-sectional views showing processes for manufacturing the semiconductor device 100.

The procedure for manufacturing the semiconductor device 100 includes, for example, the following processes:

Step 101: Mounting the first chip 109 on the lead frame 102 in such a way that the back of the semiconductor chip (first chip 109), which has the surface provided with the conductive electrode pad (first pad 117), and the back thereof, is opposing to the chip installed surface of the island 101 in the lead frame 102 having the island unit (island 101), and a plurality of the lead units 104;

Step 102: Connecting the first pad 117 and the lead unit 104 to each other through the first conductive wire (conductive upper wire 113);

Step 103: Connecting one lead unit 104 and another lead unit 104 among a plurality of lead units 104, to each other through the second conductive wire (conductive lower wire 115);

Step 104: Sealing the first chip 109 with the sealing resin 105.

Then, the first pad 117 and the lead unit 104 are connected, at the step 102, to each other through the conductive upper wire 113 on the side of the chip installed surface, and, at the same time, one lead unit 104 and another lead unit 104 are connected, at the step 103, to each other through the conductive lower wire 115 on the side of the back of the chip installed surface.

Figure 3:
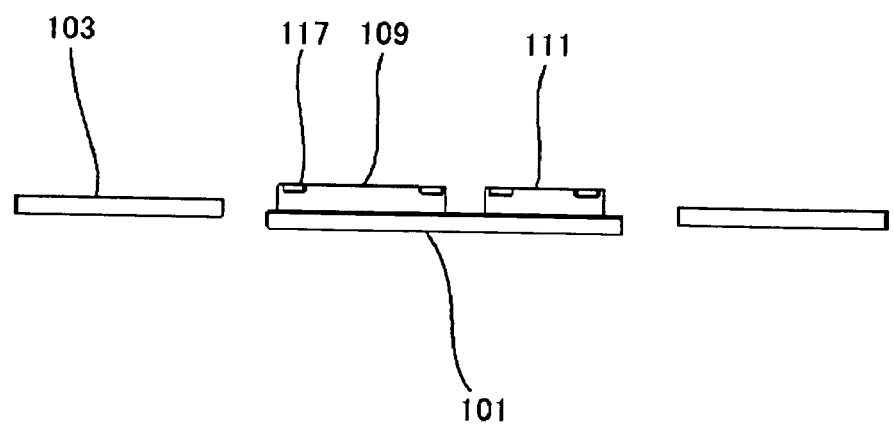
FIG. 3 is a cross-sectional view showing a process for manufacturing the semiconductor device according to an embodiment.

More specifically, the two semiconductor chips of the first chip 109 and the second chip 111 are installed (step 101) on the island 101 in the lead frame 102 in the first place, as shown in FIG. 3.

Figure 4:
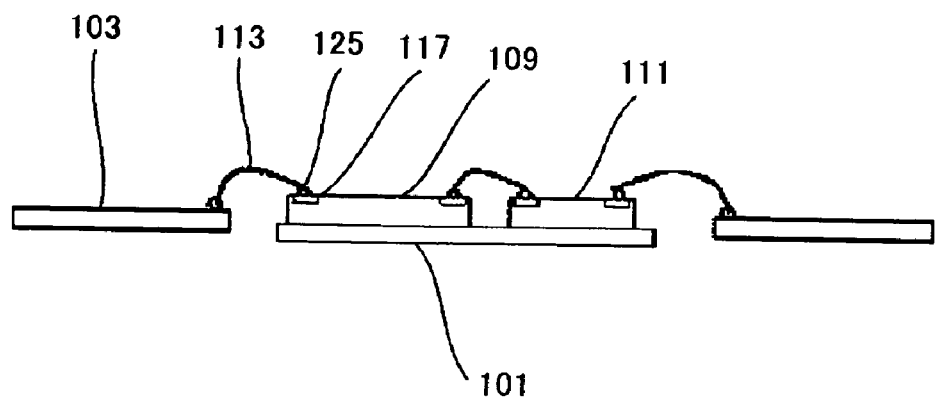
FIG. 4 is a cross-sectional view showing a process for manufacturing the semiconductor device according to an embodiment.

Then, the conductive upper wires 113 are wire-bonded (step 102) to predetermined locations for connecting between the chips, and between the chip and the first lead 103 as shown in FIG. 4.

Figure 5:
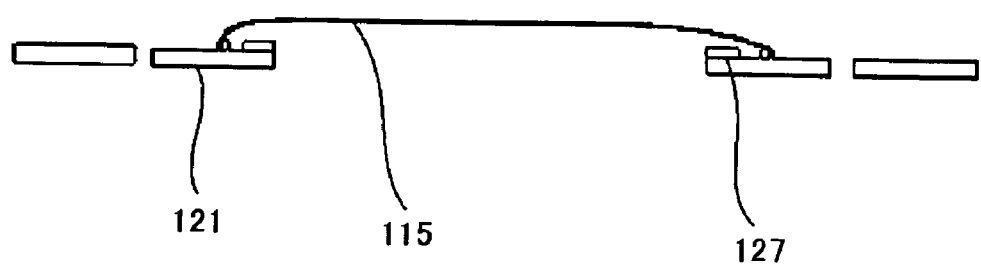
FIG. 5 is a cross-sectional view showing a process for manufacturing the semiconductor device according to an embodiment.

Subsequently, predetermined pieces of the second leads 121 are wire-bonded (step 103) with the conductive lower wire 115, using the second lead 121, as shown in FIG. 5. Here, the second lead 121 is a lead frame different from the first lead 103. Moreover, the bonding tape 127 is bonded to the end portion of the first lead 103 on the side of the island 101. When the plane shape of the island 101 is rectangular, that of the bonding tape 127 is assumed to be, for example, an annular rectangle as shown in FIG.1.

Figure 6:
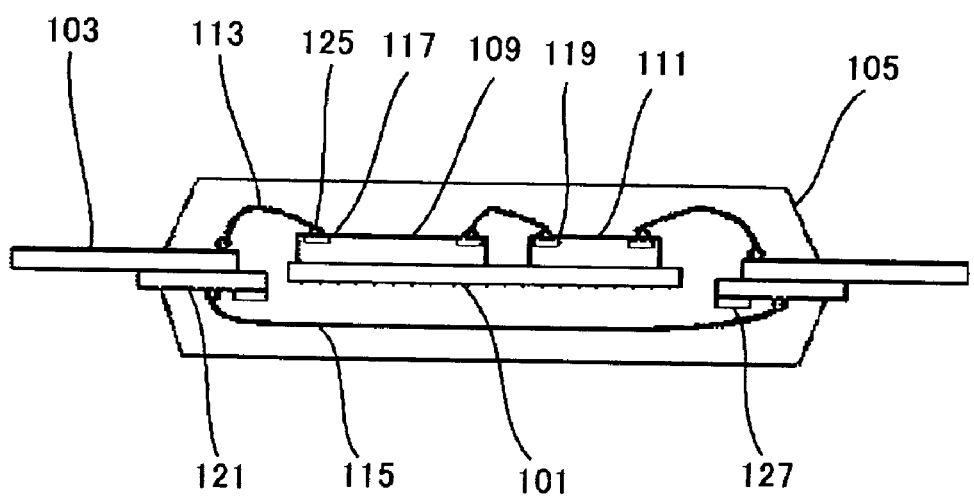
FIG. 6 is a cross-sectional view showing a process for manufacturing the semiconductor device according to an embodiment.

Then, the first lead 103 connected to the first chip 109 and the second chip 111 is set upward, and the second lead 121 including only conductive lower wiring 115 is set downward in a mold (not shown), and the sealing resin 105 is resin-sealed as shown in FIG. 6 (step 104). Here, the lead frame including only conductive lower wiring 115 is corresponding to the second lead 121. The material of the sealing resin 105 includes, for example, an organic resin material such as epoxy resin.

Figure 7:
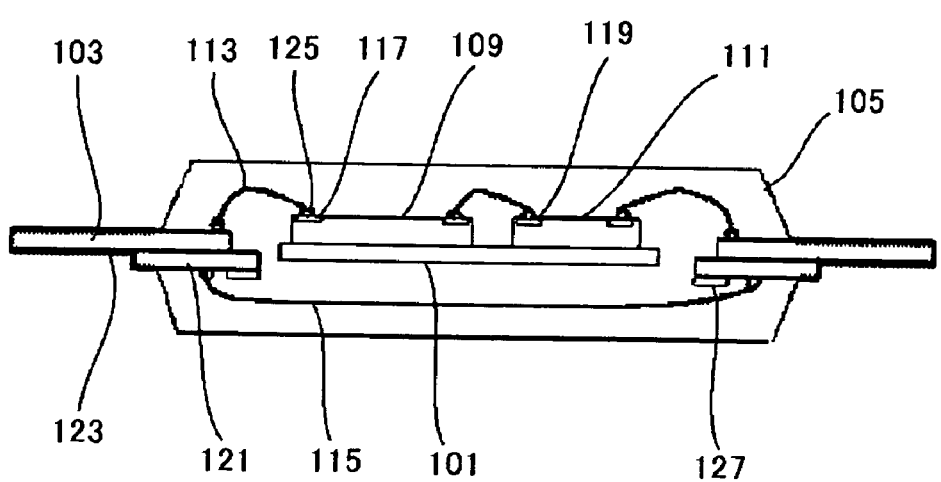
FIG. 7 is a cross-sectional view showing a process for manufacturing the semiconductor device according to an embodiment.

Furthermore, exterior plating of the lead unit 104 ranging from the first lead 103 to the second lead 121 is performed as shown in FIG. 7 to secure electric connection between the first lead 103 and the second lead 121. The semiconductor device 100 shown in FIGS. 1 and 2 is obtained by the above-described procedure.

Figure 8:
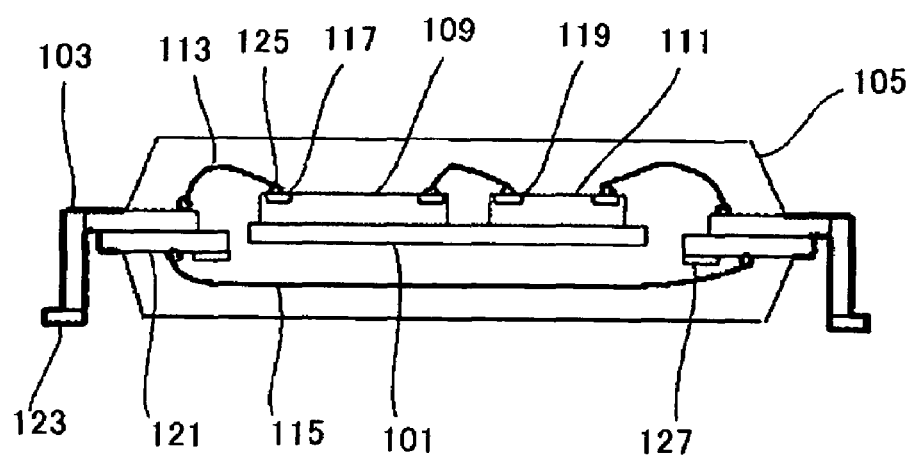
FIG. 8 is a cross-sectional view showing a process for manufacturing the semiconductor device according to an embodiment.

Moreover, the lead unit 104 may be subsequently cut to a predetermined length to mold a predetermined shape as shown in FIG. 8.

There are increased the number of the methods for forming the through path between the electrode pad and the lead unit 104 in the present embodiment because the second leads 121 in the semiconductor device 100 are connected to each other through the conductive lower wire 115. Accordingly, the flexibility in interconnection design for the whole semiconductor device 100 may be improved. More specifically, even when it is difficult, considering the whole arrangement of the semiconductor device 100, to directly connect a predetermined lead unit 104 and a predetermined electrode pad, there may be a configuration in which the electrode pad is connected to another lead unit 104, and another lead unit 104 and the predetermined lead unit 104 are connected through the conductive lower wire 115. Accordingly, there may be increased the flexibility in selection of a configuration and an arrangement for a through path between an electrode pad and an external connecting terminal, and the through path may be formed without any limitation.

Moreover, when there is adopted a configuration in which the second leads 121 are connected to each other as described in the semiconductor device 100, connecting locations of the conductive lower wire 115 may be designed, or changed according to design changes which will be done later. Thereby, the interconnection design of the semiconductor device 100 may be configured to be customized according to later design changes without changing the basic structure of the lead frames and the semiconductor chips.

Moreover, a plurality of semiconductor chips of the first chip 109 and the second chip 111 are arranged side by side on one surface of the lead frame 102 (chip installed surface) in the semiconductor device 100. When the above configuration is used, connection between the lead units causes large effects that flexibility in interconnection design is improved. Even when, for example, the predetermined first pad 117 and the predetermined second pad 119 are arranged at locations at which it is difficult to directly connect the pads 117 and 119, the pads 117 and 119 may be connected to each other by connecting the pads 117 and 119 to corresponding one of lead units 104 under a condition that the lead units 104 are connected to each other through the conductive lower wire 115. Thereby, flexibility in connection between the first chip 109 and the second chip 111 may be improved.

Moreover, in the present embodiment and the following embodiments, the wire connecting the lead units 104 may be provided on the side of the chip installed surface of the island 101, or on the side of the back of the chip installed surface as described in the semiconductor device 100. As the conductive lower wire 115 connecting the second leads 121 is arranged on the side of the back of the chip installed surface in the semiconductor device 100, the connecting reliability and the connecting stability may be further improved therein, in comparison with a case in which the wire connecting the second leads 121 is provided on the side of the chip installed surface. Hereinafter, the above-described case will be explained.

Figure 13:
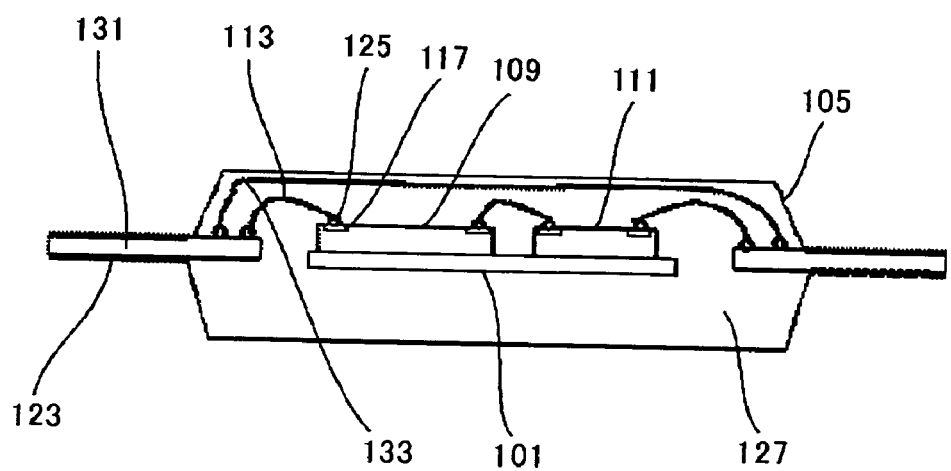
FIG. 13 is a cross-sectional view showing a configuration of a semiconductor device according to an embodiment.

FIG. 13 is a cross-sectional view showing another configuration of the semiconductor device according to the present embodiment. The basic configuration of the semiconductor device shown in FIG. 13 is similar to that of the semiconductor device 100, but the semiconductor device shown in FIG. 13 differs from the semiconductor device 100 in a point that a lead unit 104 is formed of one lead 131, while the semiconductor device 100 has the configuration in which the first lead 103 and the second lead 121 are combined to form the lead unit 104. Moreover, the semiconductor device shown in FIG. 13 is different from the semiconductor device 100 (FIG. 1) in a point that a wire 133, in stead of the conductive lower wire 115 in the device 100, is provided.

The wire 133 is provided on the side of the chip installed surface of a lead frame, and connects two leads 131. FIG. 13 illustrates a configuration in which the leads 131 arranged opposing to each other through an island 101 are connected to each other through the wire 133.

When the lead units 104 are connected to each other through a wire on the chip installed surface of the lead frame as shown in FIG. 13, a wire for connecting the lead units 104 is further arranged on semiconductor chips installed on the lead frame 102, and on the conductive upper wire 113. When a plurality of the semiconductor chips are installed on the island 101, and the leads 131 located on the both sides of the semiconductor chips are connected to each other by wire bonding as described above, the following new problems might be caused.

In the first place, there is a possibility that the wire 133 and the conductive upper wire 113 thereunder are in contact with each other when bonding through the wire 133 is performed above the conductive upper wire 113 bonding the first pad 117 and the second pad 119, or above the conductive upper wire 113 bonding the first chip 109 or the second chip 111, and the lead 131, because the position of the wire 133 in the direction of the normal to the island 101, that is, in the vertical direction is not stable when the strength of the wire 133 is comparatively low.

Moreover, when the wire 133 is further provided above the conductive upper wire 113, there is a possibility that the wire 133 protrudes to the outside of the sealing resin 105 in a state in which the wire 133 is not completely sealed with the sealing resin 105. Especially, it might be difficult in a semiconductor device of a type, by which resin sealing is performed, using an organic material such as epoxy resin, to further perform wire bonding, above a wire through which bonding has been completed, between two locations across the semiconductor chips.

Then, the semiconductor device 100 shown in FIG. 1 makes effective use of a space on the side of the back of the lead frame 102 because the device 100 has a configuration in which the lead units 104 are connected to each other on the side of the back of the chip installed surface through the conductive lower wire 115. Thereby, contact between the conductive lower wire 115 and the conductive upper wire 113, and protruding of the conductive lower wire 115 from the sealing resin 105 may be further reliably inhibited. Accordingly, the semiconductor device 100 has excellent flexibility in interconnection design, and, at the same time, a configuration superior in manufacturing stability and connecting reliability compared to that shown in FIG. 13.

Moreover, according to a configuration in which a plurality of semiconductor chips of a first chip 109 and a second chip 111 are arranged side by side on one surface (chip installed surface) of a lead frame 102 like the configuration of the semiconductor device 100, contact between an conductive upper wire 113 and a conductive lower wire 115, and defective embedding of the wire into the sealing resin 105 are further easily caused when the lead units 104 are bonded across the center portion of the first chip 109 or the second chip 111 on the side of the chip installed surface. Even in the above case, connection between the lead units 104 striding over the island 101 may be reliably performed by connecting the second leads 121 on the side of the back of the chip installed surface according to the semiconductor device 100.

Thus, the semiconductor device 100 has a configuration in which a plurality of the semiconductor chips are installed on one surface of the lead frame 102, and, at the same time, the conductive lower wire 115 is arranged on the side of the back of the chip installed surface to connect the lead units 104. Thereby, wire bonding between the lead units 104 across the first chip 109 and the second chip 111 may be stably performed with high reliability.

Moreover, while Japanese Laid-open patent publication Nos. 62-291156 and 5-152503, which have been described in the paragraph "BACKGROUND", has a configuration in which semiconductor chips are installed on the both surfaces of the lead frame, the semiconductor device 100 is configured to mount the first chip 109 and the second chip 111 on the one surface (chip installed surface) of the lead frame 102 to further reliably connect the lead units 104 on the side of the back of the lead frame 102.

Moreover, as Japanese Laid-open patent publication No. 9-283689 uses a complex-type lead frame obtained by connecting the lead frame with a multilayer wiring board, the flexibility in interconnection layout is superior to those of Japanese Laid-open patent publication Nos. 62-291156 and 5-152503, and, on the other hand, the manufacturing cost is increased in comparison with that of a lead frame with a simple configuration because Japanese Laid-open patent publication No. 9-283689 uses the complex-type lead frame.

On the other hand, flexibility in interconnection design may be improved in the present embodiment even when the lead frame 102 with a simple configuration is used, because wire bonding between the lead units 104 is performed on the side of the back of the chip installed surface in the embodiment.

Explanation will be made in the following embodiments, focusing on points different from the first embodiment.

Second Embodiment

Figure 9:
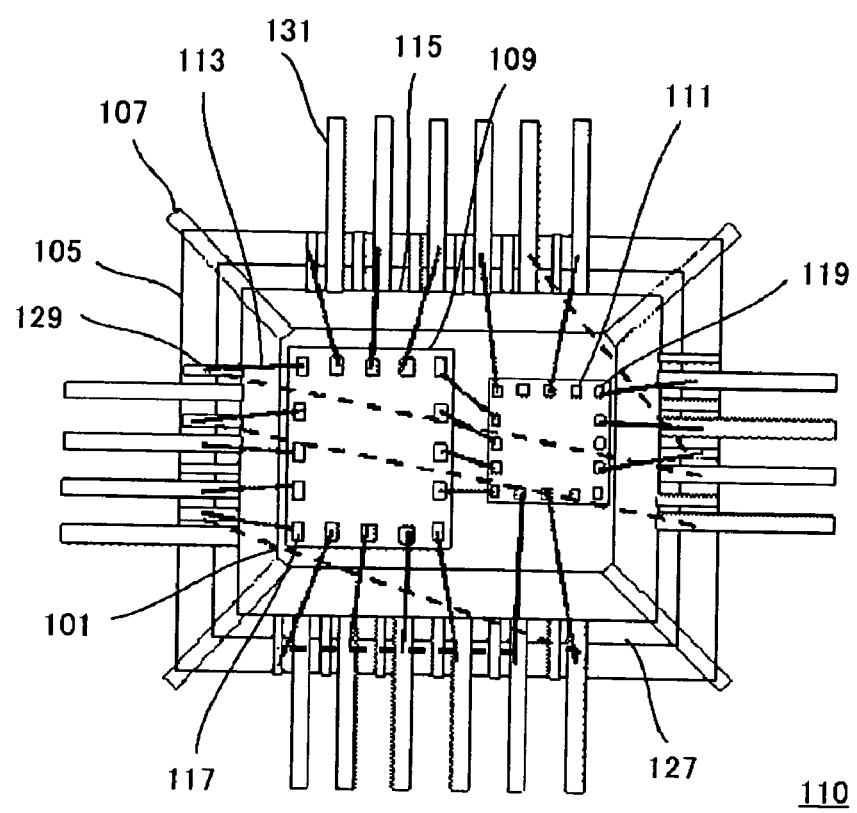
FIG. 9 is a plan view showing a configuration of a semiconductor device according to an embodiment.
Figure 10:
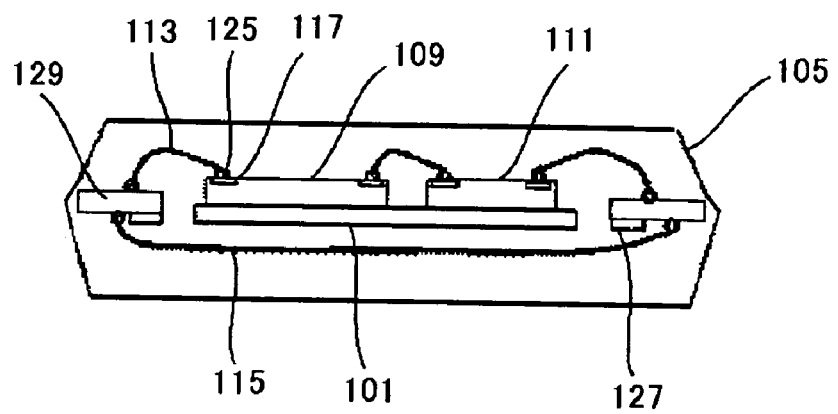
FIG. 10 is a cross-sectional view showing a configuration of the semiconductor device according to an embodiment.

FIG. 9 is a plan view showing a configuration of a semiconductor device according to the present embodiment. Moreover, FIG. 10 is a cross-sectional view showing one example of a structure of the semiconductor device according to the present embodiment in a direction normal to a chip installed surface.

The basic configuration of the semiconductor device 110 shown in FIG. 9 is similar to that of the semiconductor device 100 (FIGS. 1 and 2) described in the first embodiment, but the configuration of lead units is different from that of the first embodiment. In the semiconductor device 110, a plurality of lead units include internal leads (relay leads 129) wrapped and embedded in sealing resin 105.

More specifically, the lead unit includes a lead 131 and a relay lead 129 in the semiconductor device 110. The lead 131 is a lead which includes an outer lead unit with a function as an external connecting terminal. Even in the semiconductor device 110, the plane shape of an island 101 is rectangular, and the leads 131 are arranged in a row in the vicinity and along all the sides of the rectangular island 101.

The relay lead 129 is an internal lead without a portion protruded from the sealing resin 105. The relay lead 129 is provided with separated from the lead 131. In the semiconductor device 110, the leads 131 and the relay leads 129 are arranged in a line alternatively along the sides of the island 101 in the vicinity of the island 101. Moreover, the lead 131 and the relay lead 129 are arranged in parallel with each other in the vicinity of one side of the island 101. Moreover, the arrangement of the relay leads 129 and the leads 131 is not limited to ones shown in the drawings, and may be properly designed.

Moreover, bonding tape 127 is provided on the vicinity of the end portion, on the side of the island 101, of the leads 131 and the relay leads 129 on the side of the back of the chip installed surface of a lead frame.

A conductive lower wire 115 connects between the lead units through the island 101 even in the present embodiment. The conductive lower wire 115 is connected to the relay lead 129 in at least one end. Moreover, while FIG. 9 illustrates a configuration in which the conductive lower wire 115 connects the relay lead 129 and the lead 131, there may be applied a configuration in which the conductive lower wire 115 connects between the relay leads 129 as shown in FIG. 10. FIG. 10 illustrates a configuration in which the conductive lower wire 115 connects between the relay leads 129 which are provided, opposing to each other through the island 101 in the semiconductor device 110.

For example, the method of manufacturing the semiconductor device 100 may be applied to that of manufacturing the semiconductor device 110.

Specifically, the lead frame including the island 101, the lead 131, and the relay lead 129 is prepared in the first place. In the present embodiment, there may be used one sheet of the lead frame on which the island 101, the leads 131, and the relay leads 129 are formed.

Then, the bonding tape 127 are bonded to the lead frame in such a way that the bonding tape 127 with a shape of an annular rectangle are bonded to the tips of each lead 131. Subsequently, a first chip 109 and a second chip 111 are installed on the chip installed surface of the island 101.

Then, wire bonding which uses the conductive upper wires 113 is performed. Subsequently, the lead frame is reversed to perform wire bonding of the relay leads 129, using the conductive lower wires 115.

In the above wire bonding, the conductive upper wire 113 connects a first pad 117 of the first chip 109 or a second pad 119 chip of the second chip 111, and the relay lead 129. Then, the conductive lower wire 115 connects the relay leads 129 which do not protrude to the outside of the sealing resin 105. At this time, the connection between the relay leads 129 is performed on the side of the back of the chip installed surface. Accordingly, the conductive lower wire 115 is bonded, passing under the first chip 109 and the second chip 111. Moreover, the conductive upper wire 113 connects the relay lead 129 and a predetermined lead 131 which communicates with the outside.

Subsequently, resin sealing by sealing resin 105 is performed. The semiconductor device 110 is obtained by the above-described procedure.

Even the present embodiment may have a similar effect to that of the first embodiment because wire bonding of the lead units is performed in the present embodiment.

Moreover, the present embodiment adopts a configuration in which the lead unit includes the relay lead 129, and the relay lead 129 is used for connection on the side of the back of the chip installed surface. Thereby, the lead 131 which a function as an external terminal may be used for connection between the lead units. Accordingly, reduction of flexibility in connection with the outside terminal may be further effectively inhibited. Thereby, the lead 131 with a function as an external terminal may be further effectively used according to the present embodiment. Accordingly, flexibility in connection using an external terminal may be further improved.

Third Embodiment

Figure 11:
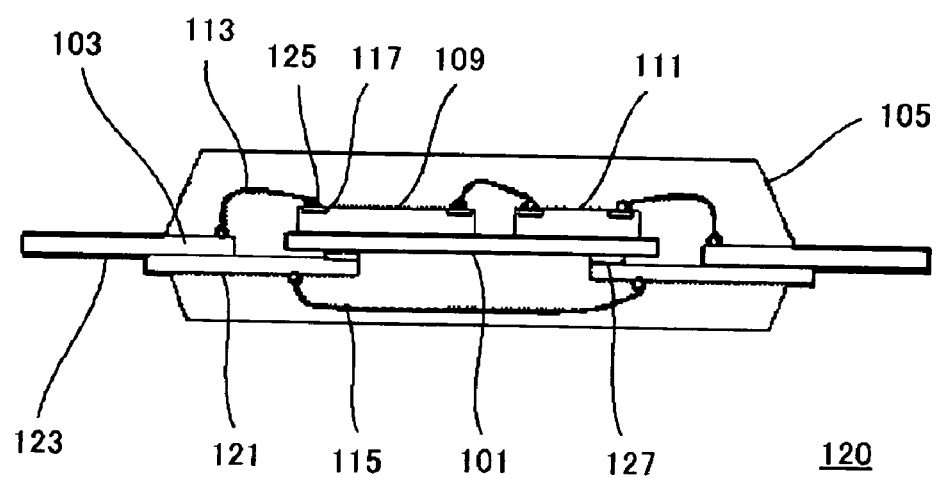
FIG. 11 is a cross-sectional view showing a configuration of a semiconductor device according to an embodiment.

FIG. 11 is a cross-sectional view showing a configuration of a semiconductor device according to the present embodiment.

The basic configuration of the semiconductor device 120 shown in FIG. 11 is similar to that of the semiconductor device 100 (FIGS. 1 and 2) described in the first embodiment, but is different therefrom in a point that an island 101 is provided above second leads 121.

Moreover, bonding tape 127 is provided between the island 101 and the second lead 121 in the semiconductor device 120. The bonding tape 127 is provided on the side of the chip installed surface of the second lead 121. Thereby, the island 101 and the second lead 121 are separated by the bonding tape 127 for insulation between the island 101 and the second lead 121 in a region in which the island 101 and the second lead 121 are opposing to each other. The bonding tape 127 is arranged in the vicinity of the tip, on the side of the island 101, of the second lead 121. Thereby, the tip of the second lead 121 is not directly contact with the island 101, and the island 101 and the second lead 121 are electrically insulated.

For example, the methods of manufacturing the semiconductor devices described in the above-described embodiments are used for assembling of the semiconductor device 120.

Even the present embodiment may have a similar effect to that of the first embodiment. Moreover, the semiconductor device 120 has a configuration in which the island 101 protrudes above the second lead 121. Thereby, the length of the conductive lower wire 115 may be reduced in comparison with that of the semiconductor device 100 described in the first embodiment. Accordingly, there may be obtained a configuration in which the leads are further stably connected to each other.

Moreover, the shape of the second lead 121 may be further diversified in the semiconductor device 120 because the second lead 121 is protruding on the side of the back of the island 101 to increase the length of the second lead 121.

Fourth Embodiment

Figure 12:
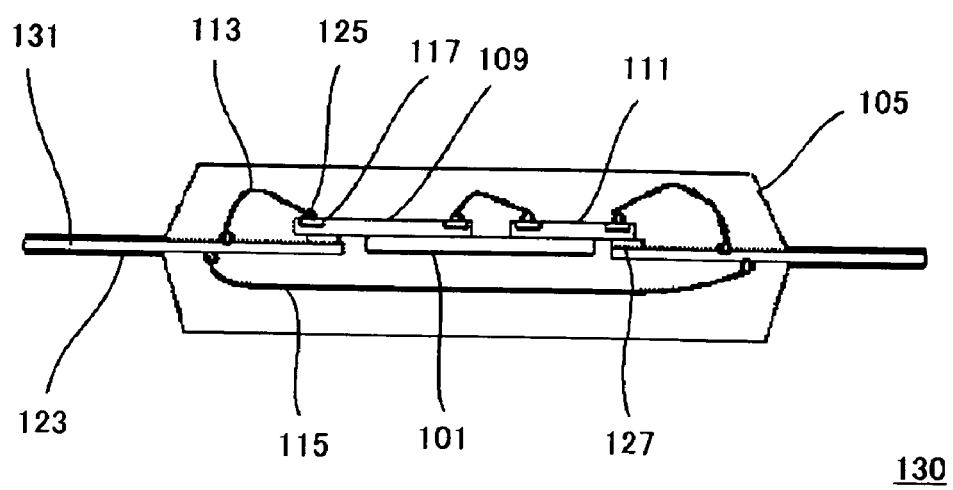
FIG. 12 is a cross-sectional view showing a configuration of a semiconductor device according to an embodiment.

FIG. 12 is a cross-sectional view showing a configuration of a semiconductor device according to the present embodiment.

The basic configuration of the semiconductor device 130 shown in FIG. 12 is similar to that of the semiconductor device 100 (FIGS. 1 and 2) described in the first embodiment, but is different therefrom in a point that a lead unit does not include a first lead 103 and a second lead 121, but have only a lead 131 arranged approximately on the same surface as that of the island 101.

The lead 131 includes a region which protrudes from sealing resin 105, and functions as an external connecting terminal. A plating film 123 covering the surface of the lead 131 is provided in the region which protrudes from the sealing resin 105.

Moreover, the island 101 is formed smaller than a region in which a first chip 109 and a second chip 111 are mounted, and the first chip 109 is mounted in a region ranging from the lead 131 to the island 101 in the semiconductor device 130. That is, the first chip 109 is mounted in the region ranging from the lead 131 to the island 101. Moreover, the second chip 111 is mounted in a region ranging from another lead 131, which is different from the lead 131 opposing to the first chip 109, to the island 101. That is, the second chip 111 is mounted in the region ranging from another lead 131, which is different from the lead 131 opposing to the first chip 109, to the island 101.

Moreover, bonding tape 127 is bonded to the vicinity of the tip, on the side of the island 101, of the lead 131. The bonding tape 127 is bonded to the side of the chip installed surface of the lead 131. Moreover, the bonding tape 127 is provided between the first chip 109 and the lead 131 and between the second chip 111 and the lead 131, and the above semiconductor chips are separated from the corresponding leads 131 for insulation.

For example, the methods of manufacturing the semiconductor devices described in the above-described embodiments are used for assembling of the semiconductor device 130.

Even the present embodiment may have a similar effect to that of the first embodiment. Moreover, the semiconductor device 130 has a configuration in which the lead 131 protrudes from the side of the back of the surface on which the first chip 109 and the second chip 111 are installed. Thereby, the length of the conductive lower wire 115 may be reduced. Accordingly, connecting stability between the leads 131 through the conductive lower wire 115 may be further improved.

Though the embodiments according to the present invention have been described above, referring to the drawings, the above embodiments are to be considered as illustrative, and various kinds of configurations other than the above-described ones may be adopted.

It is apparent that the present invention is not limited to the above embodiment, that may be modified and changed without departing from the scope and spirit of the invention.

What is claimed is:
1. A semiconductor device, comprising:
a lead frame provided with an island unit and a plurality of lead units;
a semiconductor chip mounted on a chip installed surface of said island unit, the semiconductor chip including a conductive electrode pad on a first surface opposite to a second surface mounted to said island unit;
a first conductive wire connecting said electrode pad and a lead unit in the plurality of lead units;
a second conductive wire connecting a first lead unit and a second lead unit among said plurality of lead units; and
a sealing resin sealing said semiconductor chip,
wherein the second conductive wire is disposed on a first side of the island unit opposite to a second side of the island unit which includes the chip-installed surface.

2. The semiconductor device according to claim 1, wherein said first and second lead units are disposed adjacent to different edges of said island unit.

3. The semiconductor device according to claim 1, comprising:
a plurality of said semiconductor chips.

4. The semiconductor device according to claim 3, wherein said plurality of semiconductor chips comprise:
a first semiconductor chip mounted on said island unit and connected to the first lead unit; and
a second semiconductor chip mounted on said island unit and connected to the second lead unit.

5. A semiconductor device comprising:
a lead frame provided with an island unit and a plurality of lead units;
a semiconductor chip mounted on a chip installed surface of said island unit the semiconductor chip including a conductive electrode pad on a first surface opposite to a second surface mounted to said island unit;
a first conductive wire connecting said electrode pad and a lead unit in said plurality of lead units;
a second conductive wire connecting a first lead unit and a second lead unit among said plurality of lead units; and
a sealing resin sealing said semiconductor chip,
wherein at least one of said plurality of lead units comprises:
a first lead unit portion connected to said first conductive wire; and
a second lead unit portion provided on a back surface of said first lead unit portion.

6. The semiconductor device according to claim 5, wherein said island unit is provided above said second lead unit portion.

7. A semiconductor device comprising:
a lead frame provided with an island unit and a plurality of lead units;
a semiconductor chip mounted on a chip installed surface of said island unit the semiconductor chip including a conductive electrode pad on a first surface opposite to a second surface mounted to said island unit;
a first conductive wire connecting said electrode pad and lead unit in said plurality of lead units;
a second conductive wire connecting a first lead unit and a second lead unit among said plurality of lead units; and
a sealing resin sealing said semiconductor chip,
wherein said plurality of lead units include an internal lead wrapped and embedded in said sealing resin.

8. A method of manufacturing a semiconductor device comprising:
mounting a semiconductor chip on a lead frame such that a first surface of the semiconductor chip, which includes a conductive electrode pad, is disposed opposite to a second surface of the semiconductor which is mounted on a chip installed surface of an island unit in a lead frame having said island unit and a plurality of lead units;
connecting said electrode pad and one of said plurality of lead units to each other through a first conductive wire;

connecting a first lead unit and a second lead unit, among said plurality of lead units, to each other through a second conductive wire; and sealing said semiconductor chip with sealing resins, wherein the second conductive wire is disposed on a first side of the island unit opposite to a second side of the island unit which includes the chin-installed surface.

9. The semiconductor device according to claim 5, wherein the second lead unit portion is electrically connected to the first lead unit portion and is connected to the second conductive wire.

10. The semiconductor device according to claim 7, wherein the second conductive wire is connected to the internal lead.

11. The method of manufacturing according to claim 8, wherein the first and second lead units are disposed adjacent to different edges of the island unit.

12. A method of manufacturing a semiconductor device comprising:

mounting a semiconductor chip on a lead frame such that a first surface of the semiconductor chip, which includes a conductive electrode pad, is disposed opposite to a second surface of the semiconductor which is mounted on a chip installed surface of an island unit in a lead frame having the island unit and the plurality of lead units;

connecting the electrode pad and a lead unit in the plurality of lead units to each other through a first conductive wire;

connecting a first lead unit and a second lead unit, among the plurality of lead units, to each other through a second conductive wire; and sealing the semiconductor chip with sealing resin, wherein at least one of the plurality of lead units includes a first lead unit portion connected to the first conductive wire and a second lead unit portion provided on a back surface of the first lead unit portion.

13. The method of manufacturing according to claim 12, wherein the second lead unit portion is electrically connected to the first lead unit portion and is connected to the second conductive wire.

14. A method of manufacturing a semiconductor device comprising:

mounting a semiconductor chip on a lead frame such that a first surface of the semiconductor chip, which includes a conductive electrode pad, is disposed opposite to a second surface of the semiconductor which is mounted on a chip installed surface of an island unit in a lead frame having the island unit and the plurality of lead units;

connecting the electrode pad and a lead unit in the plurality of lead units to each other through a first conductive wire;

connecting a first lead unit and a second lead unit, among the plurality of lead units, to each other through a second conductive wire; and sealing the semiconductor chip with sealing resin, wherein the plurality of lead units include an internal lead wrapped and embedded in the sealing resin.

15. The method of manufacturing according to claim 14, wherein the second conductive wire is connected to the internal lead.

16. The semiconductor device according to claim 1, wherein the first conductive wire and the second conductive wire are connected to opposing surfaces of at least one of the plurality of lead units.

17. The method of manufacturing according to claim 8, wherein the first conductive wire and the second conductive wire are connected to opposing surfaces of at least one of the plurality of lead units.

18. The method of manufacturing according to claim 8, wherein the semiconductor chip includes a plurality of semiconductor chips, wherein the plurality of semiconductor chips comprises:

a first semiconductor chip mounted on the island unit and connected to the first lead unit; and a second semiconductor chip mounted on the island unit and connected to the second lead unit.

19. The semiconductor device according to claim 4, further comprising a third conductive wire connecting the first semiconductor chip to the second semiconductor chip.

20. The method of manufacturing according to claim 18, further comprising connecting a third conductive wire to both the first semiconductor chip and the second semiconductor chip.

* * * * *